(12) United States Patent
Teramoto

(10) Patent No.: US 10,761,355 B2
(45) Date of Patent: Sep. 1, 2020

(54) PROTECTIVE PLATE AND DISPLAY DEVICE

(71) Applicant: Mitsubishi Electric Corporation, Tokyo (JP)

(72) Inventor: Hiroshi Teramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/454,758

(22) Filed: Jun. 27, 2019

(65) Prior Publication Data

US 2020/0026117 A1 Jan. 23, 2020

(30) Foreign Application Priority Data

Jul. 19, 2018 (JP) ................... 2018-135425

(51) Int. Cl.
*G02F 1/1335* (2006.01)
*G02F 1/1333* (2006.01)
*G09G 3/36* (2006.01)
*H01L 51/52* (2006.01)
*G06F 3/044* (2006.01)

(52) U.S. Cl.
CPC ......... *G02F 1/133308* (2013.01); *G09G 3/36* (2013.01); *G02F 1/13338* (2013.01); *G02F 2001/13332* (2013.01); *G02F 2001/133311* (2013.01); *G02F 2001/133331* (2013.01); *G06F 3/044* (2013.01); *G09G 2330/04* (2013.01); *H01L 51/5246* (2013.01); *H01L 51/5284* (2013.01)

(58) Field of Classification Search
None
See application file for complete search history.

(56) References Cited

U.S. PATENT DOCUMENTS

2016/0369131 A1* 12/2016 Lim ...................... G02B 5/003

FOREIGN PATENT DOCUMENTS

| JP | 2014-013266 A | 1/2014 |
| JP | 2016-107498 A | 6/2016 |

* cited by examiner

*Primary Examiner* — Richard H Kim
(74) *Attorney, Agent, or Firm* — Studebaker & Brackett PC

(57) ABSTRACT

The protective plate protects a front surface of the display device. The protective plate includes a transparent base material, an organic resin film and a multilayer film. The transparent base material has a flat plate shape and includes a main surface. The organic resin film contains a pigment and is provided on an outer peripheral portion of the main surface of the transparent base material. The multilayer film includes at least two types of thin films each having different refractive indices to ultraviolet light. Each of the at least two types of thin films is made of an inorganic material. The multilayer film is provided between the main surface of the transparent base material and the organic resin film.

13 Claims, 6 Drawing Sheets

PROTECTIVE PLATE AND DISPLAY DEVICE

BACKGROUND OF THE INVENTION

Field of the Invention

The present invention relates to a protective plate and a display device.

Description of the Background Art

Many of the information electronic devices that are in widespread use in recent years include display device devices. In order to protect a liquid crystal panel constituting the display device, a protective plate having excellent robustness is mostly provided on the front surface of the liquid crystal panel. Further, if a display device includes a touch panel, a protective plate is provided on the front surface of the touch panel to protect both the display device panel and the touch panel. Further, in order to protect the display device from external impact, water immersion, dust, and the like, the protective plate and the display panel or touch panel are fixed to each other with an adhesive (glass bonding).

Most of the protective plates have a pattern formed by printing on the outer peripheral portion thereof. The pattern is formed according to the protective plate having various specifications. For example, the pattern is formed to reduce the reflection of external light at the front of the display device and to prevent the deterioration of visibility. Alternatively, for example, the pattern is formed to enhance the design of a case of the display device, a housing or a display panel.

In general, an organic resin ink is applied to pattern printing of a protective plate. The pattern is made of a thin organic resin film, and has poor adhesion to a transparent base material constituting the protective plate. Therefore, the organic resin film is often disposed on the rear surface of the transparent base material where the user does not make direct contact, that is, the adhesion surface with the display panel. The transparent base material constituting the protective plate transmits ultraviolet light; therefore, ultraviolet light is incident from the outside on the interface at which the organic resin film and the transparent base material are in close contact with each other. The ultraviolet light decomposes organic molecules involved in the bonding of the interface between the organic resin film and the transparent base material. As a result, the bond involved in adhesion is lost and peeling of the organic resin film occurs.

Japanese Patent Application Laid-Open No. 2014-13266 discloses a display device having a transparent base material facing a cover substrate via an adhesive. A light shielding film (organic resin film) is formed on the cover substrate, and the transparent base material has a function of absorbing ultraviolet light. However, the transparent base material is disposed more inside the display device than the cover substrate provided with the light shielding film. Therefore, the display device cannot prevent the ultraviolet light incident on the light shielding film from the outside through the cover substrate, and cannot prevent ultraviolet degradation of the light shielding film.

Japanese Patent Application Laid-Open No. 2016-107498 discloses a surface protective film. The surface protection film includes a surface protection layer that cuts off the ultraviolet light. When the surface protective film is attached to the front plate (protective plate) with an adhesive, the surface protective film and the adhesive have a thickness of at least 100 μm or more. Therefore, when the surface protection film is attached so as to correspond to the organic resin film formed on the outer peripheral portion of the front plate, a step is formed on the outer peripheral portion of the front plate. Such a step causes engagement of parts in the process of assembling the housing of the display device. The position where the engagement has occurred becomes a possible starting point of peeling of the organic resin film.

SUMMARY

An object of the present specification is to provide a protective plate in which less peeling of an organic resin film occurs and improves reliability.

The protective plate in the present application protects the front surface of a display device. The protective plate includes a transparent base material, an organic resin film, and a multilayer film. The transparent base material has a flat plate shape and has a main surface. The organic resin film contains a pigment and is provided on the outer peripheral portion of the main surface of the transparent base material. The multilayer film includes at least two types of thin films each having different refractive indices to ultraviolet light. Each of the at least two thin films is made of an inorganic material. The multilayer film is provided between the main surface of the transparent base material and the organic resin film.

According to the present specification, a protective plate in which less peeling of an organic resin film occurs and improves reliability is provided.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
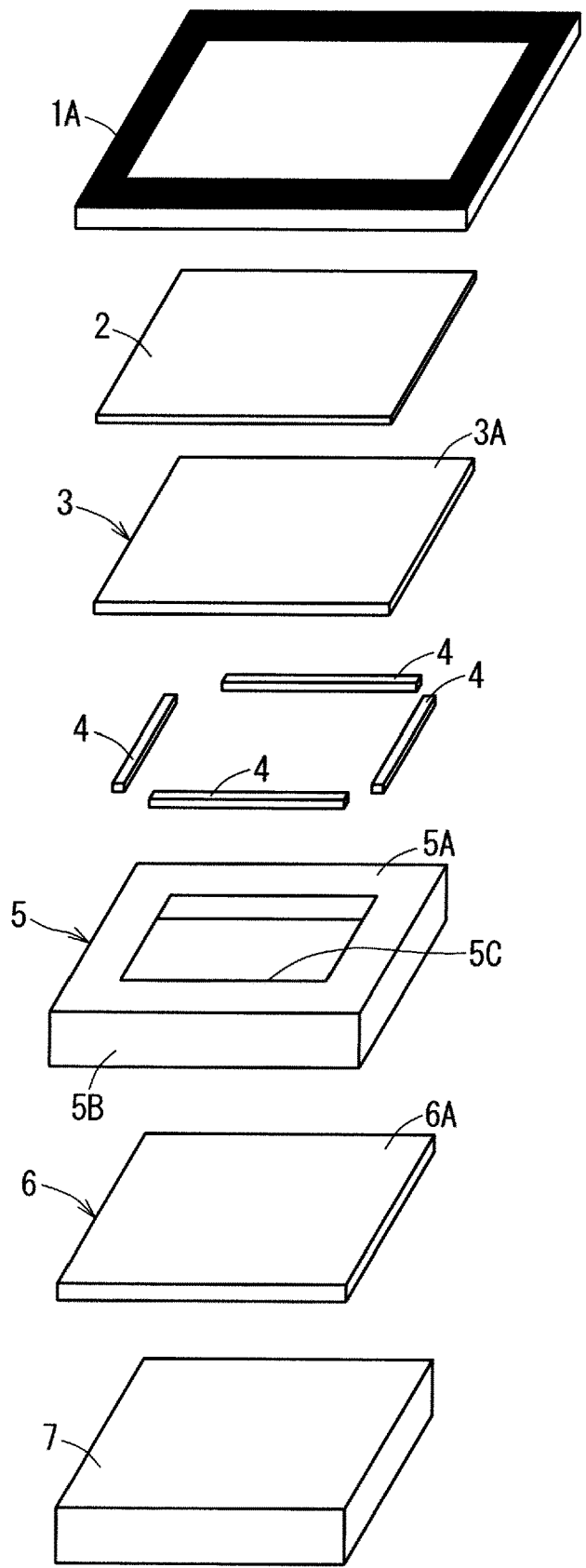
FIG. 1 is an exploded perspective view illustrating a configuration of a display device according to Embodiment 1.
Figure 2:
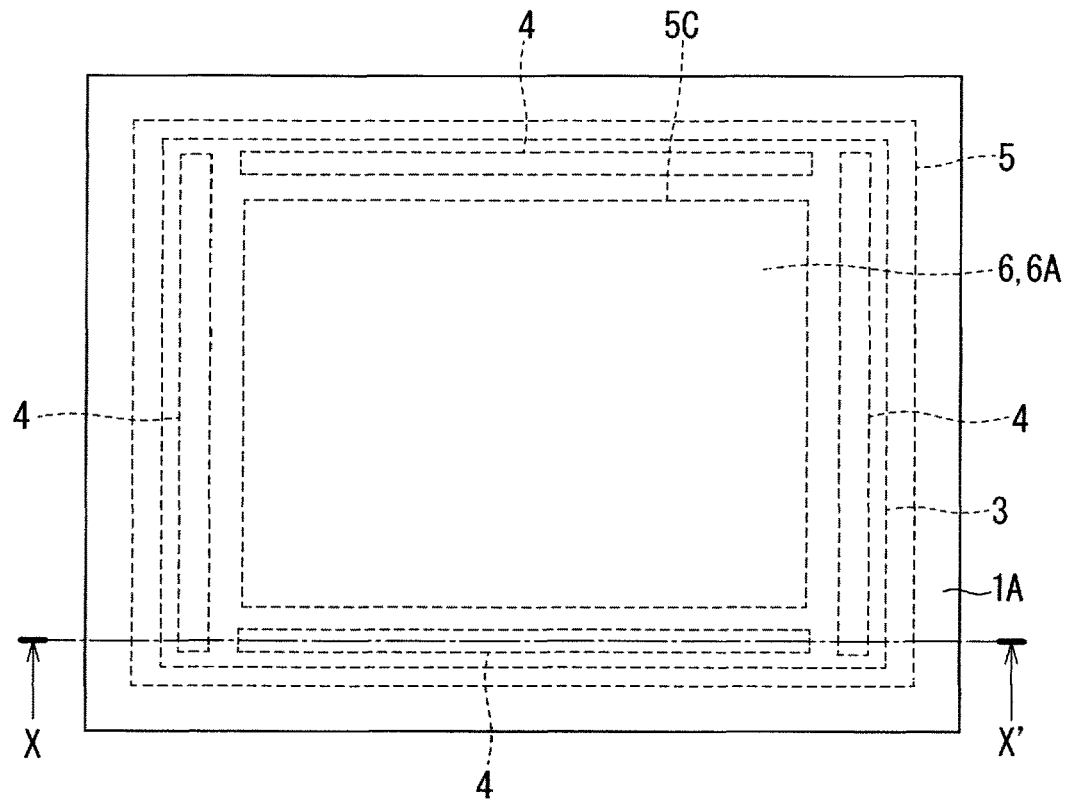
FIG. 2 is a plan view illustrating the configuration of the display device according to Embodiment 1.
Figure 3:
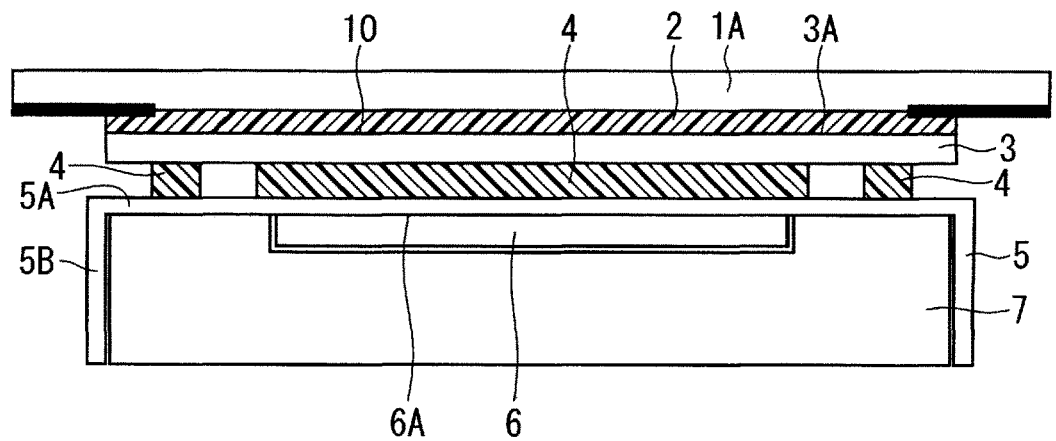
FIG. 3 is a cross-sectional view illustrating a configuration of the display device according to Embodiment 1.

FIG. 1 is an exploded perspective view illustrating a configuration of a display device according to Embodiment 1. FIG. 2 is a plan view illustrating the configuration of the display device. FIG. 3 is a cross-sectional view illustrating the configuration of the display device and illustrates a cross section taken along line X-X' indicated in FIG. 2.

The display device includes a protective plate 1A, a first adhesive member 2, a touch panel 3, a second adhesive member 4, a frame 5, a display panel 6, and a planar light source device 7.

The display panel 6 has a display surface 6A, and displays an image on the display surface 6A. The display panel 6 represents, for example, a plasma display panel, a liquid crystal panel, an Organic Light Emitting Diode (OLED) panel and so forth. In Embodiment 1, the display panel 6 represents a liquid crystal panel. Although the detailed configuration of the liquid crystal panel is not illustrated, the liquid crystal panel has a counter substrate and a Thin Film Transistor (TFT) array substrate. The counter substrate has a structure in which a coloring layer, a light shielding layer, a counter electrode, and the like are formed over an insulating substrate such as glass. The TFT array substrate has a configuration in which TFTs as switching elements, pixel electrodes and the like are formed on an insulating substrate such as glass. Further, the liquid crystal panel includes a spacer maintaining a distance between the counter substrate and the TFT array substrate, a sealing material bonding the two substrates together, a liquid crystal held by the two substrates, an alignment film for aligning the alignment of the liquid crystals, a sealing material sealing an injection port for injecting liquid crystal between the two substrates, a polarizing plate, and the like. The liquid crystal panel controls transmission of light incident from the planar light source device 7 by applying the property of birefringence of liquid crystal. The liquid crystal panel displays an image on the display surface 6A under such control.

The planar light source device 7 is disposed on the rear surface of the display panel 6. The rear surface of the display panel 6 is the surface on the opposite side to the display surface 6A. Although illustration of the detailed structure of the planar light source device 7 is omitted, the planar light source device 7 includes a light source, a light guide plate, a mold frame, and the like. The light source emits light. The light guide plate propagates the light emitted from the light source and converts the light into planar light. The mold frame holds a light guide plate or the like. The planar light source device 7 irradiates toward the rear surface of the display panel 6 with the planar light.

The frame 5 has a frame-shaped front plate portion 5A and four side plate portions 5B extending rearward from the outer peripheral portion of the front plate portion 5A. That is, the front plate portion 5A and a side plate portion 5B form an L shape, and the L shape is connected in an annular shape. The rear surface side of the frame 5 is formed open. The frame 5 houses the display panel 6 and the planar light source device 7 by enclosing them with the front plate portion 5A and the side plate portion 5B. In the front plate portion 5A of the frame 5, an opening 5C is formed. The display surface 6A of the display panel 6 is exposed from the opening 5C. The light emitted from the display surface 6A of the display panel 6 passes through the opening 5C. Further, the front plate portion 5A is disposed so as to cover the peripheral edge portion of the front surface of the planar light source device 7, and the four side plate portions 5B are disposed so as to cover the side surfaces of the planar light source device 7. With such a configuration, the frame 5 prevents light emitted from the planar light source device 7 from leaking to the outside from the portion other than the opening 5C. The frame 5 is made of a metal material or a resin material. The metal material includes, for example, aluminum, stainless steel, iron and the like. The resin material includes, for example, polycarbonate (PC), acrylonitrile butadiene styrene (ABS) and the like.

The second adhesive member 4 is a member that bonds the display panel 6 housed in the frame 5 and the touch panel 3 together. In Embodiment 1, the second adhesive member 4 is disposed on the front plate portion 5A along the peripheral edge portion of the opening 5C of the frame 5. The second adhesive member 4 bonds the front plate portion 5A and the inner peripheral portion of the touch panel 3 together. Accordingly, the display panel 6 housed in the frame 5 and the touch panel 3 are integrally connected. Alternatively, for example, the second adhesive member 4 may be disposed in a sheet shape between the display surface 6A of the display panel 6 exposed from the opening 5C of the frame 5 and the rear surface of the touch panel 3. In that case, the second adhesive member 4 bonds the display surface 6A of the display panel 6 and the rear surface of the touch panel 3 together. Accordingly, the display panel 6 housed in the frame 5 and the touch panel 3 are integrally connected. The second adhesive member 4 has adhesive surfaces on both sides of a base material. The adhesive surface may be the surface of the adhesive layer formed on the base material, or may be the surface of the adhesive base material per se. The second adhesive member 4 represents, for example, a double-sided tape. The base material represents, for example, a foam such as polyolefin. Or, for example, the base material includes an acrylic or polyurethane organic material.

The touch panel 3 is an input device having an operation surface 3A that receives an operation. In Embodiment 1, the operation surface 3A of the touch panel 3 corresponds to a front surface 10 of the display device. The touch panel 3 is provided on the front plate portion 5A of the frame 5 so as to face the display surface 6A of the display panel 6 through the opening 5C of the frame 5. Here, although the illustration of the detailed configuration of the touch panel 3 is omitted, the touch panel 3 has an electric circuit formed of a transparent electrode on a transparent substrate. The electric circuit outputs an electric signal corresponding to a position at which an operation is received from the outside (operator), that is, the coordinates in the operation surface 3A. The electrical signal is transmitted to a control circuit of the final product through an output wiring (not shown). In Embodiment 1, the touch panel 3 represents a projecting capacitance type touch panel. The projection capacitance type touch panel detects an amount of current based on a plurality of electrode patterns disposed in the operation surface 3A. The projection capacitance type touch panel measures the ratio between the amount of current at the position where the operator's fingertip or the like contacts the operation surface 3A and the amount of current in the vicinity thereof. The projection capacitance type touch panel can accurately detect the contact position of a fingertip or the like based on the ratio of the amounts of current. The upper and lower transparent substrates constituting the touch panel 3 are, for example, transparent glass substrates.

The first adhesive member 2 is a member for bonding and fixing the operation surface 3A of the touch panel 3 and the protective plate 1A.

The protective plate 1A is disposed to face the operation surface 3A of the touch panel 3. The protective plate 1A protects the operation surface 3A of the touch panel 3 which is the front surface 10 of the display device. For example, the protective plate 1A prevents damage, deformation, wear, dirt, and the like due to external pressure or contact with the touch panel 3.

Figure 4:
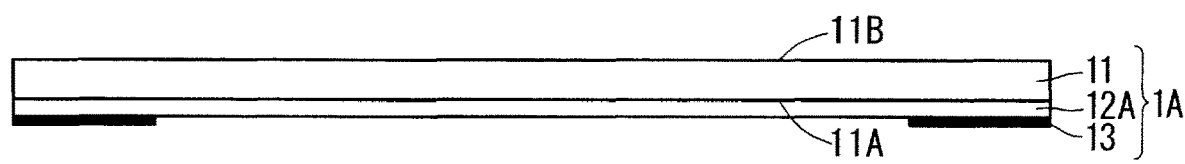
FIG. 4 is a cross-sectional view illustrating the configuration of a protective plate according to Embodiment 1.
Figure 5:
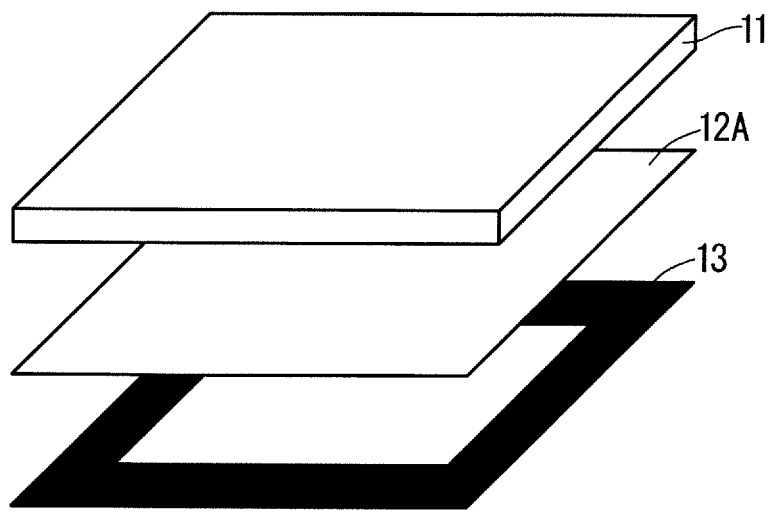
FIG. 5 is an exploded perspective view illustrating the configuration of the protective plate according to Embodiment 1.

FIG. 4 is a cross-sectional view illustrating a configuration of the protective plate 1A according to Embodiment 1, FIG. 5 is an exploded perspective view illustrating the configuration of the protective plate 1A. The protective plate 1A has a transparent base material 11, an organic resin film 13, and a multilayer film 12A.

The transparent base material 11 has a flat plate shape and has a main surface 11A. The transparent base material 11 contains, for example, glass or plastic. The transparent base material 11 is substantially transparent to at least visible light. That is, the transparent base material 11 is transparent to light for the display panel 6 to display an image on the display surface 6A. In Embodiment 1, the transparent base material 11 is a glass substrate that has high strength and is not easily deformed. The transparent base material 11 has a thickness that is thicker than the thickness of the touch panel 3. For example, when the transparent base material 11 has a thickness approximately twice or more the thickness of the touch panel 3, deformation and breakage of the protective plate 1A do not occur. The main surface 11A of the transparent base material 11 is bonded and fixed to the operation surface 3A of the touch panel 3 with the first adhesive member 2.

The organic resin film 13 is provided on the outer peripheral portion of the main surface 11A of the transparent base material 11. The organic resin film 13 contains an organic resin and a pigment. The organic resin includes, for example, an acrylic resin, an epoxy resin, a urethane resin, or a composite resin of these. The organic resin forms hydrogen bonds, intermolecular force bonds, covalent bonds and so forth, via functional groups or side chains bonding to molecules, and a chemical bond additive. The bonding causes the adhesion to be developed at the interface with the transparent base material 11 such as glass. The organic resin film 13 is formed, for example, by printing or painting. Printing is, for example, decoration printing. In the formation process, an ink in which a pigment is dispersed in an organic resin is used. The organic resin film 13 exhibits the following effects as the film contains a pigment. The organic resin film 13 reduces the reflection of external light on the front surface 10 of the display device and prevents the deterioration of the visibility. Alternatively, the organic resin film 13 enhances the design of the case, the housing or the display panel 6 of the display device. The organic resin film 13 is so-called design printing.

Figure 6:
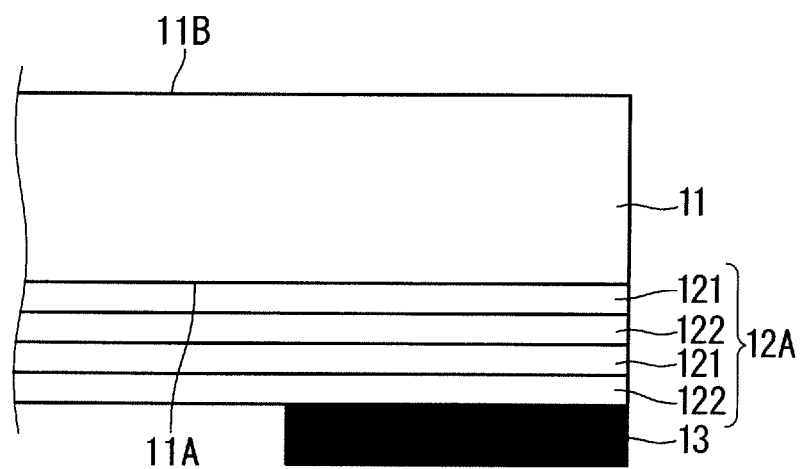
FIG. 6 is a cross-sectional view illustrating an example of a configuration of a multilayer film according to Embodiment 1.

The multilayer film 12A is provided between the main surface 11A of the transparent base material 11 and the organic resin film 13. The multilayer film 12A includes at least two types of thin films each having different refractive indices to ultraviolet light. Each of the at least two thin films is made of an inorganic material. FIG. 6 is a cross-sectional view illustrating a configuration of the multilayer film 12A according to Embodiment 1. The multilayer film 12A in FIG. 6 includes titanium oxide films 121 and silicon dioxide films 122 as at least two types of thin films. The multilayer film 12A has a four-layer structure in which the titanium oxide films 121 and the silicon dioxide films 122 are alternately and repeatedly laminated.

The multilayer film 12A also includes a titanium oxide film 121 in contact with the main surface 11A of the transparent base material 11 and a silicon dioxide film 122 in contact with the organic resin film 13. The contact between the silicon dioxide film 122 and the organic resin film 13 improves the adhesion of the two. That is, the wettability equivalent to a glass substrate is achieved.

The thickness of the multilayer film 12A is preferably 10 µm or less. Each thin film has a thickness in which a value of one-fourth of the wavelength of ultraviolet light is multiplied by a predetermined constant related to the refractive index of each thin film. For example, when the multilayer film 12A has a ten-layer structure, the thickness of the multilayer film 12A is about 2 µm.

Figure 7:
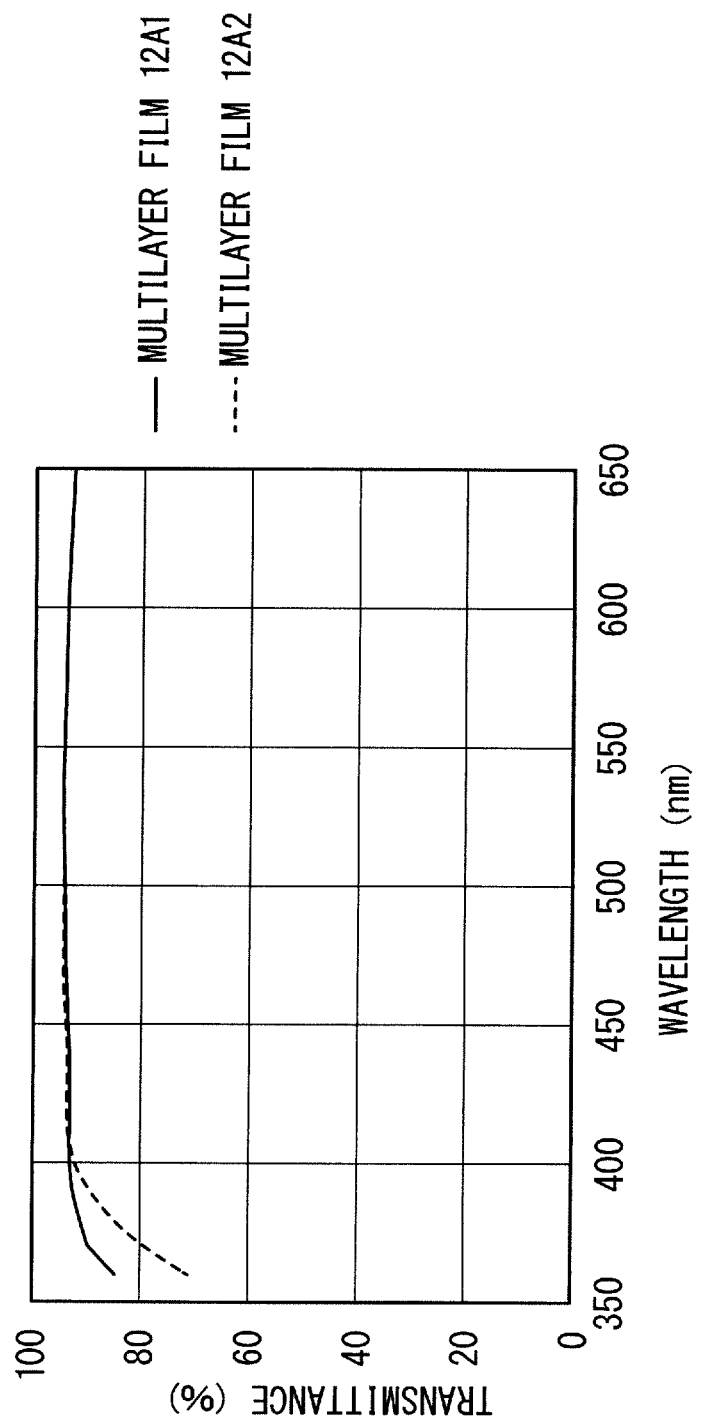
FIG. 7 is a graph illustrating transmission spectra of multilayer films according to Embodiment 1.

The ultraviolet light incident from the other main surface 11B of the transparent base material 11 passes through the transparent base material 11 and enters the multilayer film 12A. The other main surface 11B of the transparent base material 11 is a surface positioned on the opposite side to the main surface 11A of the transparent base material 11. In addition, the other main surface 11B is a surface facing the outside of the display device, and is, for example, a surface positioned on the operator side. The ultraviolet light reflected at one interface and the ultraviolet light reflected at other interface in the multilayer film 12A interfere with each other to reduce the transmittance. Or, the ultraviolet light reflected at one interface and the ultraviolet light reflected at other interface in the multilayer film 12A interfere with each other to reduce the transmittance. FIG. 7 is a graph illustrating transmission spectra of multilayer films according to Embodiment 1. The transmittances of a multilayer film 12A1 and a multilayer film 12A2 in FIG. 7 both decrease in the ultraviolet wavelength range. In particular, the transmittance of the multilayer film 12A2 in a wavelength range of 400 nm or less is reduced, and the transmittance for ultraviolet light having a wavelength of 360 nm is about 70%.

Organic resin generally tends to be decomposed by high energy light such as ultraviolet light. This is because high energy light breaks molecular bonds. When the bonds of molecules constituting the organic resin are broken by the ultraviolet light, film peeling occurs. However, in the protective plate 1A in Embodiment 1, the multilayer film 12A reduces the amount of ultraviolet light incident in the organic resin film 13. That is, the protective plate 1A provided with the multilayer film 12A prevents the deterioration of the organic resin film 13 with ultraviolet light.

In Embodiment 1, an example in which at least two types of thin films are thin films of titanium oxide and thin films of silicon dioxide is shown; however, the thin films are not limited thereto. The multilayer film 12A may be a multilayer film 12A including a plurality of transparent inorganic films such as niobium dioxide, silicon nitride, and indium tin oxide. That is, each of the at least two types of thin films contains any one material selected from titanium oxide, silicon dioxide, niobium dioxide, silicon nitride, and indium tin oxide.

Summarizing the above, the protective plate 1A in Embodiment 1 protects the front surface 10 of the display device. The protective plate 1A includes the transparent base material 11, the organic resin film 13, and the multilayer film 12A. Transparent base material 11 has a flat plate shape and includes the main surface 11A. The organic resin film 13 contains the pigment, and is provided on the outer peripheral portion of the main surface 11A of the transparent base material 11. The multilayer film 12A includes at least two types of thin films each having different refractive indices to ultraviolet light. Each of the at least two types of thin film is made of an inorganic material. The multilayer film 12A is provided between the main surface 11A of the transparent base material 11 and the organic resin film 13.

According to the protective plate 1A having the above configuration, the transmittance of the ultraviolet light passing through the multilayer film 12A is reduced, and the ultraviolet light incident on the interface between the transparent base material 11 and the organic resin film 13 is reduced. Less peeling of the organic resin film 13 occurs, and the reliability (durability) of the protective plate 1A to ultraviolet light is improved. In addition, the multilayer film 12A is disposed on the main surface 11A of the transparent base material 11 positioned on the opposite side to the other main surface 11B of the transparent base material 11. That is, the engagement of the step of the multilayer film 12A itself does not induce the peeling of the organic resin film 13.

Further, at least two types of thin films of protective plate 1A in Embodiment 1 include a thin film containing titanium oxide and a thin film containing silicon dioxide.

With the above configuration, the multilayer film 12A being low in cost and high in reliability can be realized.

The multilayer film 12A of the protective plate 1A in Embodiment 1 includes a thin film containing titanium oxide in contact with the main surface 11A of the transparent base material 11 and a thin film containing silicon dioxide in contact with the organic resin film 13.

The contact between the silicon dioxide and the organic resin film 13 improves the adhesion of the two. That is, the wettability equivalent to a glass substrate is improved.

That is, each of the at least two types of thin films of the protective plate 1A according to Embodiment 1 contains any one of titanium oxide, silicon dioxide, niobium dioxide, silicon nitride, and indium tin oxide.

With the above configuration, the multilayer film 12A that reduces the transmittance of ultraviolet light can be realized.

In addition, the ultraviolet light transmittance of the multilayer film 12A of the protective plate 1A in Embodiment 1 is 75% or less.

According to the above configuration, the transmittance of the ultraviolet light passing through the multilayer film 12A is reduced, and the ultraviolet light incident on the interface between the transparent base material 11 and the organic resin film 13 is reduced. Therefore, less peeling of the organic resin film 13 occurs, and the reliability (durability) of the protective plate 1A is improved.

In addition, the thickness of the multilayer film 12A of the protective plate 1A according to Embodiment 1 is preferably 10 μm or less.

When the thickness of the multilayer film 12A is 10 μm or less, the step does not cause inconvenience in the normal operation by the operator of the display device or the normal operation by the assembler in the manufacturing process.

In addition, the display device in Embodiment 1 includes the protective plate 1A, the touch panel 3 and the display panel 6. The touch panel 3 has the operation surface 3A as the front surface that receives an operation. The operation surface 3A is provided to face the main surface 11A of the transparent base material 11 of the protective plate 1A. The display panel 6 is provided facing the rear surface which is the surface on the opposite side to the operation surface 3A of the touch panel 3.

According to the above configuration, the transmittance of the ultraviolet light passing through the multilayer film 12A is reduced, and the ultraviolet light incident on the interface between the transparent base material 11 and the organic resin film 13 is reduced. Therefore, less peeling of the organic resin film 13 occurs, and the reliability (durability) of the display device to ultraviolet light is improved.

Modification of Embodiment 1

Even when the display device is not provided with the touch panel 3, the same effect as in Embodiment 1 is produced. When the touch panel 3 is not provided, the protective plate 1A is disposed to face the display surface 6A of the display panel 6. That is, in Modification of Embodiment 1, the front surface 10 of the display device is the display surface 6A of the display panel 6. The protective plate 1A protects the display surface 6A of the display panel 6 which is the front surface 10 of the display device.

According to the above configuration, the transmittance of the ultraviolet light passing through the multilayer film 12A is reduced, and the ultraviolet light incident on the interface between the transparent base material 11 and the organic resin film 13 is reduced. Therefore, less peeling of the organic resin film 13 occurs, and the reliability (durability) of the display device to ultraviolet light is improved.

Embodiment 2

A protective plate ant a display device in Embodiment 2 will be described. Descriptions of the configuration and operations similar to that of Embodiment 1 will be omitted.

As illustrated in FIG. 7, a multilayer film reduces not only the wavelength range of ultraviolet light, but also the transmittance of light of near 400 nm, that is, near ultraviolet light and violet (or blue) light. Therefore, when the multilayer film is disposed so as to overlap with the display surface 6A of the display panel 6, the transmittance of purple (or blue) light of the light for displaying the image is reduced, and the image may possibly be recognized yellowish. The protective plate in Embodiment 2 solves such a problem.

Figure 8:
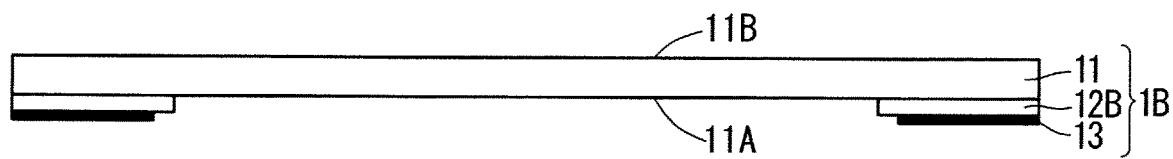
FIG. 8 is a cross-sectional view illustrating a configuration of a protective plate according to Embodiment 2.
Figure 9:
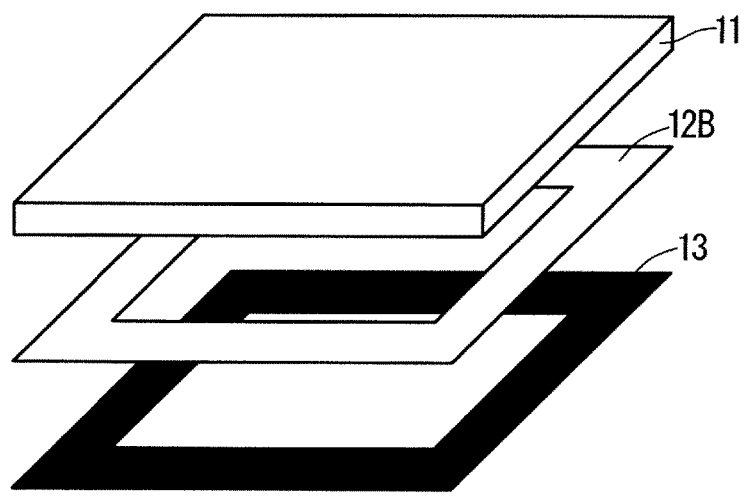
FIG. 9 is an exploded perspective view illustrating the configuration of the protective plate according to Embodiment 2.

FIG. 8 is a cross-sectional view illustrating a configuration of a protective plate 1B according to Embodiment 2. FIG. 9 is an exploded perspective view illustrating the configuration of the protective plate 1B.

The configuration of the transparent base material 11 and the organic resin film 13 are the same as in Embodiment 1. That is, the organic resin film 13 is provided on the outer peripheral portion of the main surface 11A of the transparent base material 11.

A multilayer film 12B in Embodiment 2 is provided in a region overlapping with the organic resin film 13 in plan view. The multilayer film 12B is not provided in the area overlapping with the display surface 6A of the display panel 6. Such a multilayer film 12B is formed, for example, by patterning the multilayer film 12B formed on the main surface 11A of the transparent base material 11.

With such a configuration, transmission of light emitted from the display panel 6 is not hindered by the multilayer film 12B. Therefore, no yellowish image is displayed, and the reliability of the protective plate 1B and the display device against ultraviolet light is also improved.

Embodiment 3

A protective plate ant a display device in Embodiment 3 will be described. Descriptions of the configuration and operations similar to that of Embodiments 1 and 2 will be omitted.

Figure 10:
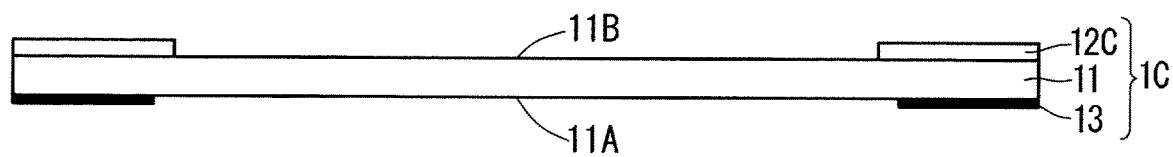
FIG. 10 is a cross-sectional view illustrating a configuration of a protective plate according to Embodiment 3.
Figure 11:
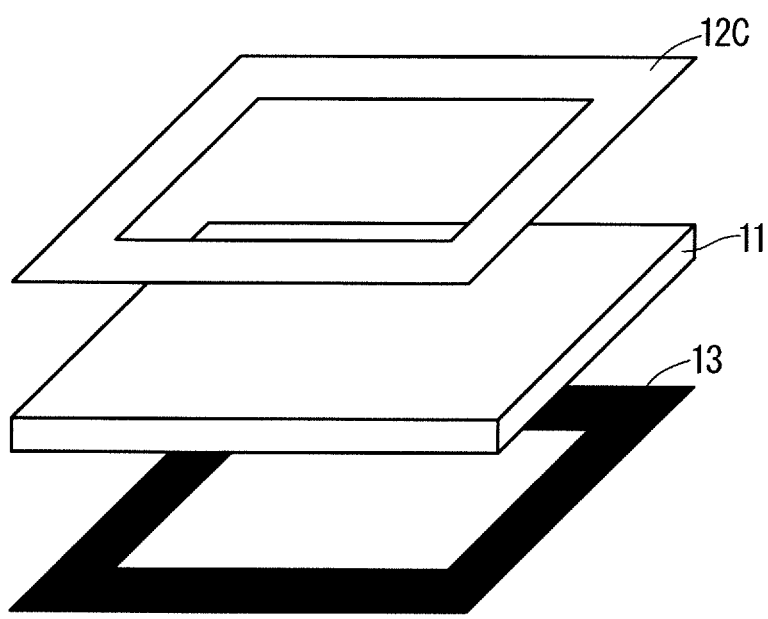
FIG. 11 is an exploded perspective view illustrating the configuration of the protective plate according to Embodiment 3.

FIG. 10 is a cross-sectional view illustrating a configuration of a protective plate 1C according to Embodiment 3. FIG. 11 is an exploded perspective view illustrating the configuration of the protective plate 1C.

The configuration of the transparent base material 11 and the organic resin film 13 are the same as in Embodiment 1. That is, the organic resin film 13 is provided on the outer peripheral portion of the main surface 11A of the transparent base material 11.

A multilayer film 12C in Embodiment 3 is provided in a region overlapping with organic resin film 13 in plan view, and in the region of another main surface 11B facing the main surface 11A of transparent base material 11. When the multilayer film 12C is made of an inorganic oxide, the multilayer film 12C is preferably prevented from moisture. By providing the multilayer film 12C on the other main surface 11B of the transparent base material 11, provision of a prevention film for protecting the multilayer film 12C from moisture on the transparent base material 11 is ensured.

Such a configuration improves the reliability of the multilayer film 12C against moisture. Therefore, no yellowish image is displayed, and the reliability of the protective plate 1C and the display device against ultraviolet light is also improved as in Embodiment 2.

It should be noted that Embodiments of the present invention can be arbitrarily combined and can be appropriately modified or omitted without departing from the scope of the invention.

While the invention has been described in detail, the forgoing description is in all aspects illustrative and not restrictive. It is understood that numerous other modifications and variations can be devised without departing from the scope of the invention.

What is claimed is:

1. A protective plate protecting a front surface of a display device, comprising:
   a transparent base material having a flat plate shape and having a main surface;
   an organic resin film containing a pigment and provided on an outer peripheral portion of the main surface of the transparent base material; and
   a multilayer film including at least two types of thin films each having different refractive indices to ultraviolet light, each of the at least two types of thin films being made of an inorganic material, the multilayer film including a film being in contact with the main surface of the transparent base material and containing titanium oxide and a film being in contact with the organic resin film and containing silicon dioxide, wherein
   the multilayer film is provided between the main surface of the transparent base material and the organic resin film.

2. The protective plate according to claim 1, wherein each of the at least two types of thin films contains any one of titanium oxide, silicon dioxide, niobium dioxide, silicon nitride, and indium tin oxide.

3. The protective plate according to claim 1, wherein an ultraviolet light transmittance of the multilayer film is 75% or less.

4. The protective plate according to claim 1, wherein the multilayer film has a thickness of 10 μm or less.

5. The protective plate according to claim 1, wherein the multilayer film is provided in a region overlapping with the organic resin film in plan view.

6. A display device, comprising:
   the protective plate according to claim 1; and
   a display panel having a display surface as the front surface, the display surface being provided to face the main surface of the transparent base material of the protective plate.

7. A display device, comprising:
   the protective plate according to claim 1;
   a touch panel having an operation surface configured to receive an operation as the front surface, the operation surface being provided to face the main surface of the transparent base material of the protective plate; and
   a display panel being provided to face a rear surface being a surface on an opposite side to the operation surface of the touch panel.

8. A protective plate protecting a front surface of a display device, comprising:
   a transparent base material having a flat plate shape and having a main surface;
   an organic resin film containing a pigment and provided on an outer peripheral portion of the main surface of the transparent base material; and
   a multilayer film including at least two types of thin films each having different refractive indices to ultraviolet light, each of the at least two types of thin films being made of an inorganic material, the multilayer film including a film being in contact with the main surface of the transparent base material and containing titanium oxide and a film being in contact with the organic resin film and containing silicon dioxide, wherein
   the multilayer film is provided in a region overlapping with the organic resin film in plan view and in the region in another main surface facing the main surface of the transparent base material.

9. The protective plate according to claim 8, wherein each of the at least two types of thin films contains any one of titanium oxide, silicon dioxide, niobium dioxide, silicon nitride, and indium tin oxide.

10. The protective plate according to claim 8, wherein an ultraviolet light transmittance of the multilayer film is 75% or less.

11. The protective plate according to claim 8, wherein the multilayer film has a thickness of 10 μm or less.

12. A display device, comprising:
   the protective plate according to claim 8; and
   a display panel having a display surface as the front surface, the display surface being provided to face the main surface of the transparent base material of the protective plate.

13. A display device, comprising:
   the protective plate according to claim 8;
   a touch panel having an operation surface configured to receive an operation as the front surface, the operation surface being provided to face the main surface of the transparent base material of the protective plate; and
   a display panel being provided to face a rear surface being a surface on an opposite side to the operation surface of the touch panel.

* * * * *